(12) United States Patent
Lin

(10) Patent No.: US 7,164,104 B2
(45) Date of Patent: Jan. 16, 2007

(54) IN-LINE HEATER FOR USE IN SEMICONDUCTOR WET CHEMICAL PROCESSING AND METHOD OF MANUFACTURING THE SAME

(75) Inventor: Hongy Lin, Chesterfield, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 97 days.

(21) Appl. No.: 10/867,108

(22) Filed: Jun. 14, 2004

(65) Prior Publication Data

US 2005/0274714 A1    Dec. 15, 2005

(51) Int. Cl.
*H05B 3/16* (2006.01)
(52) U.S. Cl. .................. 219/543; 219/548; 219/552
(58) Field of Classification Search .......... 219/543, 219/548, 552–554, 444.1; 399/328, 329; 338/303, 308
See application file for complete search history.

(56) References Cited

U.S. PATENT DOCUMENTS

| | | | |
|---|---|---|---|
| 3,304,459 A | | 2/1967 | Shaw |
| 3,515,850 A | * | 6/1970 | Cady, Jr. .................. 347/208 |
| 3,852,583 A | | 12/1974 | Bohorquez et al. |
| 3,875,413 A | * | 4/1975 | Bridgham ................ 250/492.1 |
| 4,213,030 A | | 7/1980 | Kawamura et al. |
| 4,378,489 A | * | 3/1983 | Chabinsky et al. ......... 219/543 |
| 4,472,723 A | * | 9/1984 | Shibata ...................... 347/206 |
| 4,644,141 A | * | 2/1987 | Hagen et al. .............. 219/543 |
| 4,703,328 A | * | 10/1987 | Jones et al. ................. 343/704 |
| 5,155,340 A | * | 10/1992 | Morita et al. ............. 219/543 |
| 5,397,769 A | | 3/1995 | Higaki et al. |
| 5,408,069 A | * | 4/1995 | Mischel, Jr. ................ 219/219 |
| 5,788,094 A | | 8/1998 | Kiuchi et al. |
| 5,790,752 A | | 8/1998 | Anglin et al. |
| 5,895,591 A | | 4/1999 | Kojima et al. |
| 5,951,896 A | | 9/1999 | Mahawili |
| 6,037,574 A | | 3/2000 | Lanham et al. |
| 6,144,802 A | | 11/2000 | Kim |
| 6,222,166 B1 | * | 4/2001 | Lin et al. .................... 219/538 |
| 6,486,447 B1 | * | 11/2002 | Miyata .................... 219/444.1 |
| 6,495,808 B1 | * | 12/2002 | Clayton et al. ............. 219/548 |
| 6,580,061 B1 | | 6/2003 | Black |
| 6,596,960 B1 | * | 7/2003 | Brook-Levinson et al. ..................... 219/121.47 |
| 6,636,062 B1 | * | 10/2003 | Gaasch et al. .............. 324/760 |

(Continued)

FOREIGN PATENT DOCUMENTS

GB    1039780    8/1966

(Continued)

*Primary Examiner*—Robin Evans
*Assistant Examiner*—Vinod Patel
(74) *Attorney, Agent, or Firm*—Harness, Dickey & Pierce P.L.C.

(57) ABSTRACT

An in-line heater for use in semiconductor wet chemical processing comprises a single crystal alumina substrate, a resistive heating element disposed on the single crystal alumina substrate, and a protective layer disposed over the resistive heating element. The single crystal alumina substrate has a moderate coefficient of thermal expansion (CTE) that is substantially equivalent to the CTEs of the resistive heating element and the protective layer. Therefore, cracking between the substrate and the protective layer can be minimized. The in-line heater in accordance with this invention exhibits an excellent corrosion-resistance capability even at high temperature and can carry a wide variety of corrosive chemicals including hydrofluoride solution.

27 Claims, 4 Drawing Sheets

U.S. PATENT DOCUMENTS

| | | | |
|---|---|---|---|
| 6,664,515 B1 * | 12/2003 | Natsuhara et al. | 219/444.1 |
| 6,826,382 B1 * | 11/2004 | Sanpei et al. | 399/328 |
| 6,888,101 B1 * | 5/2005 | Davis | 219/201 |
| 2003/0063931 A1 * | 4/2003 | Sanpei et al. | 399/328 |

FOREIGN PATENT DOCUMENTS

| | | | |
|---|---|---|---|
| JP | 54041937 A | * | 4/1979 |

\* cited by examiner

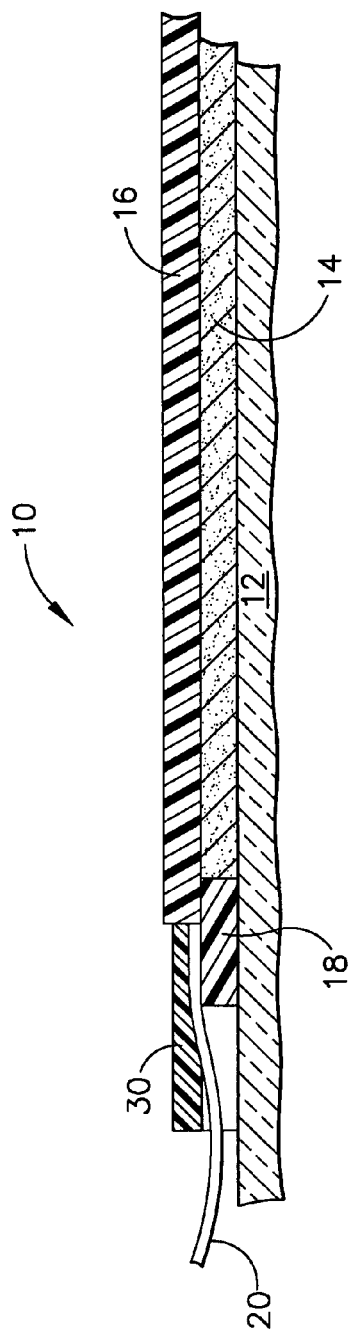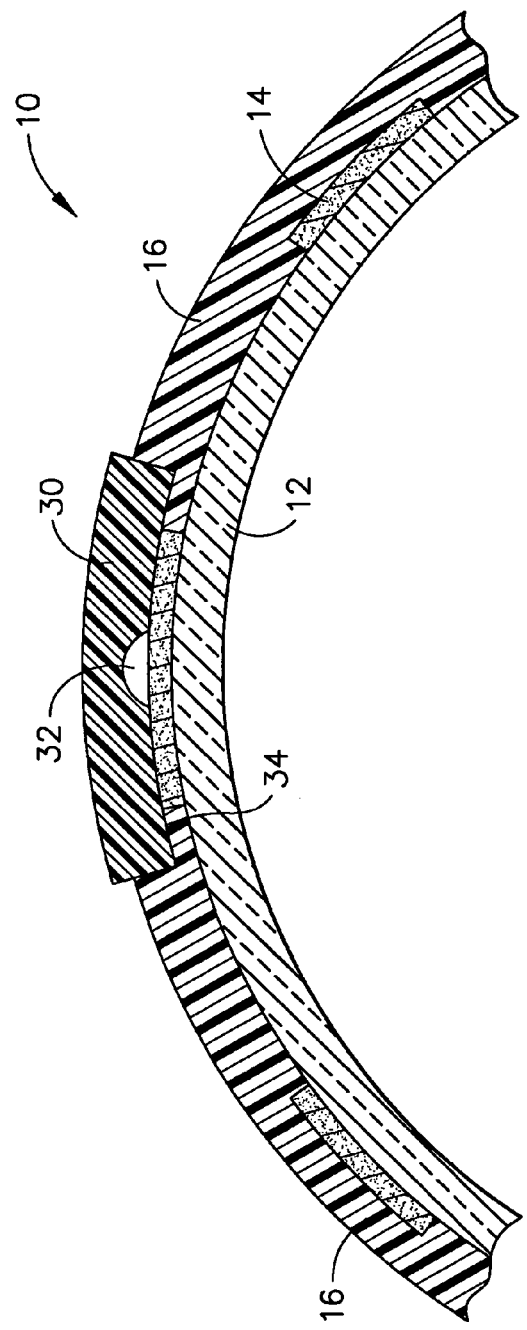
FIG. 2 (SEC. A-A)
FIG. 3 (SEC. B-B)

IN-LINE HEATER FOR USE IN SEMICONDUCTOR WET CHEMICAL PROCESSING AND METHOD OF MANUFACTURING THE SAME

FIELD OF THE INVENTION

The present invention relates generally to electric heaters, and more particularly to in-line heaters for use in semiconductor wet chemical processing, and the method of manufacturing the same.

BACKGROUND OF THE INVENTION

Semiconductor wet chemical processing in-line heaters are known in the art. A conventional wet chemical processing in-line heater can be either a radiation type or a direct-heating type. A radiation-type heater often includes a Teflon tube for carrying wet chemicals to be heated and an infrared heating source, such as an infrared lamp, located outside the Teflon tube, wherein the wet chemicals are heated by the infrared lamp through radiation. Unfortunately, radiation-type heaters are often inefficient at heating and are prone to contamination. It is well known that heating by radiation inevitably causes a significant amount of heat loss. Moreover, Teflon tubes are vulnerable to chemicals at high temperatures and are likely to release particulate matters into the chemicals to be heated, thereby leading to contamination problems.

A conventional direct-heating type heater includes a tube with a resistive heating element on the exterior surface of the tube, which is electrically connected to a power source. When power is supplied, the resistive heating element heats the chemicals flowing within the tube by conductive heating, which is more efficient than heating by radiation since there is less heat loss. Among the conventional materials, quartz has been known as a superior material for the tube for direct-heating type heaters because quartz has better chemical corrosion resistance properties than any other conventional materials such as stainless steel and can withstand deionized water and corrosive chemicals, such as acids. However, the corrosion resistance properties of quartz degrades as the temperature increases. Therefore, like other conventional materials, quartz is also vulnerable to chemical corrosion at high temperature, as evidenced by corrosion often occurring at portions of a quartz tube where the tube contacts the resistive heating element. For example, the quartz tube can be etched by corrosive chemicals to a depth of about 0.040 inches (0.016 cm) after about two (2) years of use. Like other conventional materials, quartz cannot carry hydrofluoride (HF) solution due to its inherent vulnerability to HF solution.

While quartz exhibits superior chemical resistance properties than other conventional materials, quartz has a deficiency in that it is difficult to find an appropriate dielectric material as a protective layer to cover over the tube and the resistive heating element without causing cracks between the protective layer and the substrate. Quartz has a relatively low coefficient of thermal expansion (CTE) of about $5.5 \times 10^{-7}/°$ C., while the commonly used dielectric materials, such as silicate based glass frit, have much higher CTEs ranging from about $4.5 \times 10^{-6}$ to about $9 \times 10^{-6}/°$ C. The difference in thermal expansion among the protective layer, resistor element, and the substrate creates thermal stresses, which results in cracks on the substrate. The general solution to this problem is to provide a tube without a protective layer. In the absence of a protective layer, however, the resistive heating element is exposed to the outside environment, which could lead to damage of the resistive heating element.

Conventional tube materials pose another problem in that a reliable electrical connection between the resistive heating element and the power source is often difficult to achieve. In some known heaters, lead wires cannot be used to directly connect the resistive heating element to the power source due to the difference in thermal expansion between the metallic lead wires and the tube. A common solution to this problem is to use a mechanical device, such as a loaded spring, to connect the resistive heating element to the lead wires. However, fatigue of such a mechanical device can occur after long periods of use, which may significantly increase the probability of failure of the connection between the resistive heating element and the power source. Moreover, fatigue is accelerated when the mechanical device is used at higher temperatures.

SUMMARY OF THE INVENTION

In one preferred form, a heater for use in semiconductor wet chemical processing is provided that comprises a single crystal alumina substrate, a resistive heating element disposed on the single crystal alumina substrate, and a protective layer disposed over the resistive heating element.

In another form, a heater for use in semiconductor wet chemical processing is provided that comprises a single crystal alumina substrate and a resistive heating element disposed on the single crystal alumina substrate. Additionally, a heater for use in semiconductor wet chemical processing is provided that comprises a single crystal alumina substrate.

In yet another form, a heater for use in semiconductor wet chemical processing is provided that comprises a single crystal alumina substrate, a resistive heating element disposed on the single crystal alumina substrate, and a protective layer disposed over the resistive heating element. Additionally, terminal pads are connected to the resistive heating element, lead wires are connected to the terminal pads, and strain relief caps disposed over the connection of the lead wires to the terminal pads.

Additionally, another heater for use in semiconductor wet chemical processing is provided that comprises a substrate comprising a material having a substrate coefficient of thermal expansion, the substrate being resistant to chemicals of wet chemical processing. Further, a resistive heating element is provided that is disposed on the substrate, the resistive heating element comprising a material having a resistive heating element coefficient of thermal expansion, and a protective layer is disposed over the resistive heating element, the protective layer comprising a material having a protective layer coefficient of thermal expansion. According to this form of the present invention, the coefficients of thermal expansion are substantially equivalent to reduce thermal stresses induced during manufacture of the heater.

According to a method of the present invention, a method of forming a heater for use in semiconductor wet chemical processing is provided that comprises the steps of applying a resistive heating element onto a single crystal alumina, applying terminal pads to the single crystal alumina substrate, the terminal pads being connected to the resistive heating element, applying a protective layer over the resistive heating element, applying a bonding material onto the terminal pads, and placing lead wires onto the terminal pads and in contact with the bonding material.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 2 is an enlarged cross-sectional view, taken along line A—A of FIG. 1, of the in-line heater in accordance with the teachings of the present invention;

FIG. 3 is an partial enlarged cross-sectional view, taken along line B—B of FIG. 2, of the in-line heater in accordance with the teachings of the present invention;

DETAILED DESCRIPTION OF THE PREFERRED EMBODIMENTS

The following description of the preferred embodiments is merely exemplary in nature and is in no way intended to limit the invention, its application, or uses.

Figure 1:
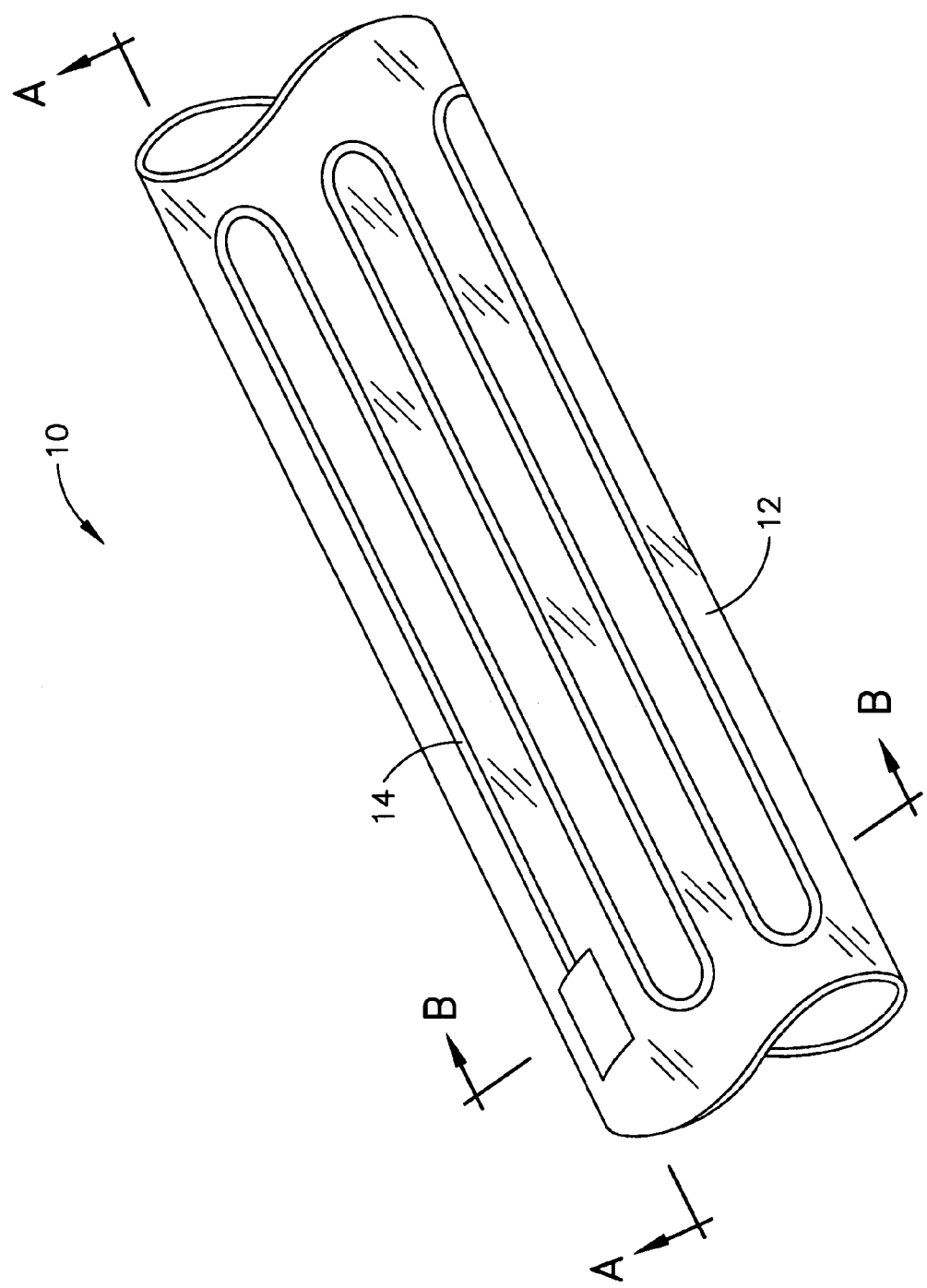
FIG. 1 is a perspective view of an in-line heater for use in semiconductor wet chemical processing and constructed in accordance with the teachings of the present invention.

Referring to FIG. 1, a semiconductor wet chemical processing in-line heater in accordance with the present invention is illustrated and generally indicated by reference numeral 10. The in-line heater 10 preferably defines a tubular configuration as shown and further comprises a substrate 12 and a resistive heating element 14 applied directly on the substrate 12. In accordance with the teachings of the present invention, the substrate 12 is formed of single crystal alumina ($Al_2O_3$), also known as sapphire. The single crystal alumina has extreme purity and has a moderate CTE of about $8 \times 10^{-6}$/° C., as opposed to conventional direct-heating type substrates that have a much lower CTE of about $5.5 \times 10^{-7}$/° C. The single crystal alumina also exhibits excellent chemical durability across a wide range of processing temperatures. For example, the single crystal alumina is chemically inert and is insoluble and corrosion resistant to most common industrial solutions, such as hydrofluoric, sulfuric and hydrochloric acid. As to chemical durability at high temperature, the single crystal alumina can withstand higher temperatures and is insoluble in water, $HNO_3$, $H_2SO_4$ and HCl up to 300° C. Additionally, unlike conventional materials, the single crystal alumina is corrosion resistant to hydrofluoride (HF) solution. Moreover, the single crystal alumina has higher mechanical strength than conventional materials, and the fatigue life of a substrate made of single crystal alumina is approximately four (4) times longer than that of a substrate made of conventional materials under similar operating conditions.

Preferably, the resistive heating element 14 is made of Platinum (Pt) based conducting material, a Silver (Ag) based conducting material, a Palladium (Pd) based conducting material, or combinations thereof. The resistive heating element 14 is applied on the exterior surface of the substrate 12 and may be formed in a serpentine pattern as illustrated, among other types of patterns. The pattern of the resistive heating element 14 depends on specific design requirements, such as power level and power distribution, among others. Accordingly, the illustration of a serpentine pattern is exemplary only and should not be construed as limiting the scope of the present invention. It should be understood that while FIG. 1 shows a series circuit, a parallel circuit may also be used while remaining within the scope of the present invention.

Figure 4:
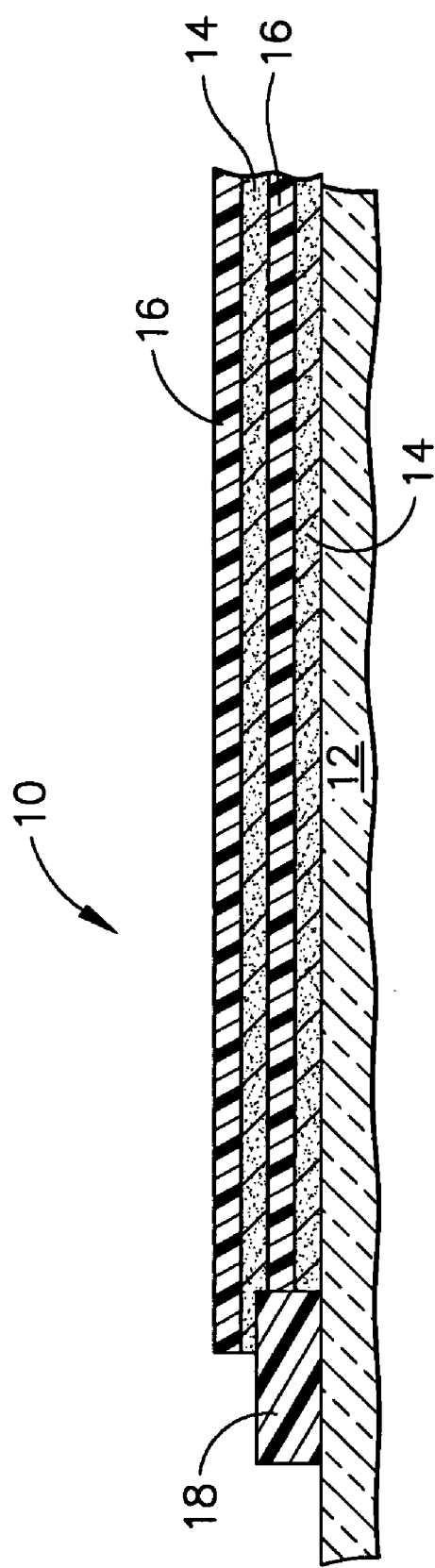
FIG. 4 is an enlarged cross-sectional view of an in-line heater comprising multiple resistive layers constructed in accordance with another embodiment of the present invention.

Referring now to FIGS. 2 and 3, the in-line heater 10 further comprises a protective layer 16 applied over the resistive heating element 14 in one form of the present invention. However, it should be understood that the in-line heater 10 may be provided with or without a protective layer 16. The in-line heater 10 also comprises terminal pads 18 (only one of which is shown for purposes of clarity) for electrical connection of the resistive heating element 14 to lead wires 20 (again, only one of which is shown for purposes of clarity). Although only one resistive layer (i.e., resistive heating element 14) is shown, it should be understood that the in-line heater may also include multiple resistive layers, separated by dielectric layers, as shown in FIG. 4, while remaining within the scope of the present invention.

The resistive heating element 14 may be formed within a range of thicknesses, depending on the specific design requirements of the in-line heater 10 and the layering process used to form the resistive heating element 14. The resistive heating element 14 is formed through application or accumulation of a material to a substrate using processes associated with thick film, thin film, thermal spraying, or sol-gel, among others, as described in co-pending application Ser. No. 10/752,359, titled "Combined Material Layering Technologies for Layered Heaters," filed Jan. 6, 2004, which is commonly assigned with the present application and the contents of which are incorporated herein by reference in their entirety. For example, in one form the resistive heating element 14 is formed by a thick film process such as screen printing or by direct writing as disclosed in U.S. Pat. No. 5,973,296, which is commonly assigned with the present application and the contents of which are incorporated herein by reference in their entirety. In another form, the resistive heating element 14 is formed by a thin film process such as chemical vapor deposition (CVD) or physical vapor deposition (PVD). It should be understood that other layered heater processes may also be employed to form the resistive heating element 14 and/or the protective layer 16 without departing from the scope of the present invention.

Because of the moderate CTE of single crystal alumina, wider variety of materials can be selected to form the resistive heating element 14 to reduce the risk of cracking. Using a thick film process, the resistive heating element 14 is preferably a material comprising a mixture of conductive noble metal powder and silicate based glass frit. The noble metals are selected from a group consisting of gold (Au), silver (Ag), platinum (Pt) and Palladium (Pd), and any combination thereof. Preferably, the silicate based glass frit has a CTE between about $4.5 \times 10^{-6}$ and about $9 \times 10^{31}$ $^6$/° C., the glass transition temperature is between about 400° C. and about 700° C., and the sheet resistivity is between about 20 mΩ/sq and about 80 mΩ/sq. Using a thin film process, the resistive heating element 14 is preferably made of a material comprising a platinum. The CTE of the resistive heating element 14 is also between approximately 4.5× $10^{-6}$/° C. and approximately 9×$10^{-6}$/° C.

The terminal pads 18 are preferably made of a material comprising a mixture of a conductive noble metal powder and glass frit and have a sheet resistivity lower than about 5 mΩ/sq. As with the resistive heating element 14, the silicate based glass frit for the terminal pads 18 has a CTE of about 4.5×$10^{-6}$ to about 9×$10^{-6}$/° C. Unlike the resistive heating element 14, however, the glass frit used for the terminal pads 18 preferably has a glass transition temperature between about 400° C. to about 650° C.

The lead wires 20 are preferably bonded to the terminal pads 18 to electrically connect the resistive heating element 14 to a power source (not shown). To provide improved conductivity, the lead wires 20 are preferably made of a material selected from the group consisting of nickel and silver.

The protective layer 16 is preferably a dielectric material for electrical isolation and protection of the resistive heating element 14 from the operating environment. Additionally, the protective layer 16 may cover a portion of the terminal pads 18 so long as there remains sufficient area to promote an electrical connection with the power source. Because the substrate 12 has a CTE similar to a wide variety of dielectric materials, it is not difficult to find a protective layer 16 that provides insulation for the underlying resistive heating element 14 without cracking between or within the protective layer 16 and the resistive heating element 14 by the thermal stresses. Preferably, the protective layer 16 is made of silicate based glass frit, having a CTE between approximately 4.5×$10^{-6}$/° C. and approximately 9×$10^{-6}$/° C. Further, the glass transition temperature is preferably between about 400° C. to about 650° C.

As further illustrated in FIGS. 2 and 3, a strain relief cap 30 is employed in one form of the present invention to protect the connection between the lead wire 20 and the terminal pad 18. Preferably, an integral groove 32 is formed along a lower surface of the strain relief cap 30 to receive the lead wire 20 therein and to confine the lead wire 20 within the groove 32. The strain relief cap 30 also reduces the likelihood of the lead wire 20 being pulled at an angle from the terminal pad 18, thereby providing a more reliable electrical connection between the lead wire 20 and the terminal pad 18. As further shown, the strain relief cap 30 is slightly larger than the terminal pad 18 and has a curved lower surface 34, as best shown in FIG. 3, which approximates the same curvature as the exterior surface of the substrate 12, thereby resulting in an improved fit with the terminal pad 18 and the substrate 12. Preferably, the strain relief cap 30 is made of a material comprising sintered alumina that has a purity higher than about 99.5%.

Figure 5:
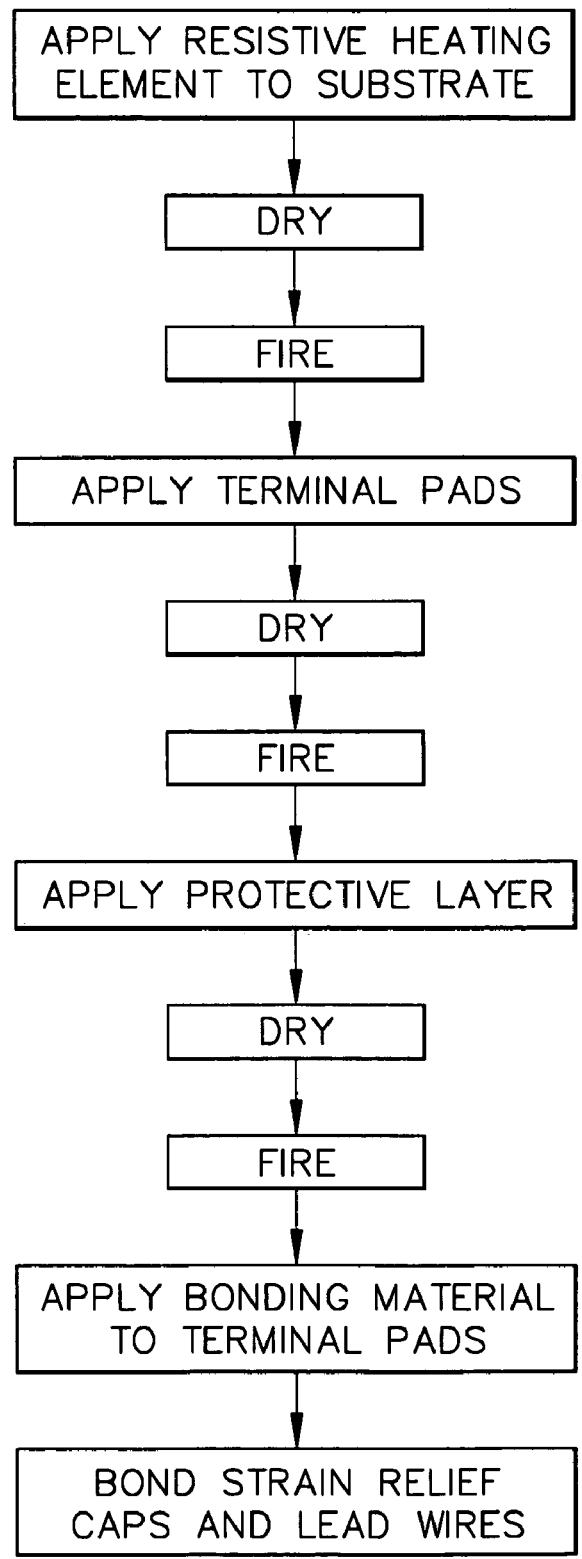
FIG. 5 is a schematic flow diagram of a manufacturing process for forming an in-line heater in accordance with the teachings of the present invention.

Processes of forming the in-line heater 10, including application of the resistive heating element 14 and terminal pads 18 to the substrate 12 and subsequent connection of the lead wires 20 are now described in greater detail. Referring to FIG. 5, using a thick film process, the resistive heating element material is first applied onto a tubular single crystal alumina substrate using screen printing or direct writing method, depending on the heating trace design, to form the resistive heating element 14. After the resistive heating element material is applied, the material is dried to remove any organic solvents. Thereafter, the resistive heating element material is fired to form the thick film resistive heating element 14. The thick film resistive heating element 14 is fired at about 800° C. to 1250° C., depending on the materials used for the resistive heating element 14.

After the resistive heating element 14 is formed, the material for the terminal pads is applied onto the substrate 12 at the connecting ends of the resistive heating element 14. Similar to the process of forming the resistive heating element 14, the material is dried and fired to form the terminal pads 18.

Next, the material for the protective layer 16 is applied over the resistive heating element 14 and the substrate 12, but not completely over the terminal pads 18 to provide for an electrical connection with the lead wires 20. Similar to the processes of forming the resistive heating element 14 and the terminal pads 18, the material is dried and fired to form the protective layer 16. Thereafter, a bonding material is applied to the terminal pads 18 and a portion of the substrate 12 adjacent the terminal pads 18 to connect the strain relief caps 30 and lead wires 20. A preferred bonding material is a material comprising a glass frit and silver powder and having glass transition temperature between about 400° C. to about 500° C. Finally, the entire assembly is dried and then fired to complete the in-line heater 10 in accordance with the teachings of the present invention.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A heater for use in semiconductor wet chemical processing comprising:
   a single crystal alumina substrate comprising an exterior surface and an interior surface;
   a resistive heating element disposed on and in contact with the exterior surface of the single crystal alumina substrate; and
   a protective layer disposed over and in contact with the resistive heating elements,
   wherein the interior surface of the single crystal alumina substrate is exposed to chemical solutions of the semiconductor wet chemical processing such that the chemical solutions are in direct contact with the single crystal alumina substrate.

2. The heater of claim 1, further comprising terminal pads electrically connected to the resistive heating element.

3. The heater of claim 1, wherein the substrate defines a tubular configuration.

4. The heater of claim 1, wherein the resistive heating element is made of a material comprising a mixture of conductive noble metal powder and glass frit.

5. The heater of claim 4, wherein the conductive noble metal is selected from a group consisting of silver, platinum, gold, palladium, and combinations thereof.

6. The heater of claim 1, wherein the resistive heating element is made of a material comprising platinum.

7. The heater of claim 1, wherein the terminal pads are made of a material comprising a mixture of a conductive noble metal powder and glass frit.

8. The heater of claim 1, wherein the protective layer comprises a silicate based glass frit.

9. A heater for use in semiconductor wet chemical processing comprising:
   a single crystal alumina substrate comprising an exterior surface and an interior surface; and
   a resistive heating element disposed on and in contact with the exterior surface of the single crystal alumina substrate,
   wherein the interior surface of the single crystal alumina substrate is exposed to chemical solutions of the semiconductor wet chemical processing such that the chemical solutions are in direct contact with the single crystal alumina substrate.

10. The heater of claim 9 further comprising a plurality of resistive heating element layers.

11. A heater for use in semiconductor wet chemical processing comprising:
   a single crystal alumina substrate comprising an exterior surface and an interior surface;
   a resistive heating element disposed on and in contact with the exterior surface of the single crystal alumina substrate;
   a protective layer disposed over the resistive heating element;
   terminal pads connected to the resistive heating element;
   lead wires connected to the terminal pads; and
   strain relief caps disposed over the connection of the lead wires to the terminal pads,
   wherein the interior surface of the single crystal alumina substrate is exposed to chemical solutions of the semiconductor wet chemical processing such that the chemical solutions are in direct contact with the single crystal alumina substrate.

12. The heater of claim 11, wherein the resistive heating element is made of a material comprising a mixture of conductive noble metal powder and glass frit.

13. The heater of claim 12, wherein the conductive noble metal is selected from a group consisting of silver, gold, palladium, platinum, and combinations thereof.

14. The heater of claim 11, wherein the resistive heating element is made of a material comprising a platinum material.

15. The heater of claim 11, wherein the terminal pads are made of a material comprising a mixture of a conductive noble metal powder and glass frit.

16. The heater of claim 11, wherein the protective layer comprises a silicate based glass frit.

17. The heater of claim 11, wherein the lead wires comprise a material selected from the group consisting of nickel and silver.

18. The heater of claim 11, wherein the strain relief caps are made of a material comprising sintered alumina.

19. The heater of claim 11, wherein each of the strain relief caps further comprises an integral groove for placement of the lead wires.

20. The heater of claim 11, further comprising a bonding material disposed between the terminal pads, the lead wires, and the strain relief caps.

21. The heater of claim 11, wherein the bonding material is a material comprising a glass frit and silver powder.

22. A heater for use in semiconductor wet chemical processing comprising:
   a substrate comprising a single crystal alumina substrate having coefficient of thermal expansion, the substrate comprising an exterior surface and an interior surface and being resistant to chemicals of wet chemical processing;
   a resistive heating element disposed on the exterior surface of the substrate, the resistive heating element comprising a material having a resistive heating element coefficient of thermal expansion; and
   a protective layer disposed over the resistive heating element, the protective layer comprising a material having a protective layer coefficient of thermal expansion,
   wherein the coefficients of thermal expansion are substantially equivalent to reduce thermal stresses induced during manufacture of the heater, and the interior surface of the substrate is exposed to chemical solutions of the semiconductor wet chemical processing such that the chemical solutions are in direct contact with the substrate.

23. The heater of claim 22, wherein the substrate coefficient of thermal expansion is approximately $8 \times 10^{-6}/°$ C., the resistive heating element coefficient of thermal expansion is between approximately $4.5 \times 10^{-6}/°$ C. and approximately $9 \times 10^{-6}/°$ C., and the protective layer coefficient of thermal expansion is between approximately $4.5 \times 10^{-6}/°$ C. and approximately $9 \times 10^{-6}/°$ C.

24. A method of forming a heater for use in semiconductor wet chemical processing comprising the steps of:
   (a) forming a tubular single crystal alumina substrate defining an exterior surface and an interior surface;
   (b) applying a resistive heating element onto the exterior surface of the single crystal alumina substrate;
   (c) applying terminal pads to the single crystal alumina substrate, the terminal pads being connected to the resistive heating element;
   (d) applying a protective layer over the resistive heating element;
   (e) applying a bonding material onto the terminal pads;
   (f) placing lead wires onto the terminal pads and in contact with the bonding material; and
   (g) exposing the interior surface of the single crystal alumina substrate.

25. The method of claim 24, further comprising the step of placing a strain relief cap over the connection between the lead wires and the terminal pad.

26. The method of claim 24, further comprising a drying step and a firing step following each of steps (a), (b), and (c).

27. The method of claim 24, wherein the resistive heating element is formed by a layering process selected from the group consisting of thick film, thin film, thermal spray, and sol-gel.

* * * * *

UNITED STATES PATENT AND TRADEMARK OFFICE
CERTIFICATE OF CORRECTION

| | | |
|---|---|---|
| PATENT NO. | : 7,164,104 B2 | Page 1 of 1 |
| APPLICATION NO. | : 10/867108 | |
| DATED | : January 16, 2007 | |
| INVENTOR(S) | : Hongy Lin | |

It is certified that error appears in the above-identified patent and that said Letters Patent is hereby corrected as shown below:

In Column 6, line 36, "elements" should be --element--.

In Column 7, claim 21, line 49 "The heater of claim 11" should be --The heater of claim 20--.

Signed and Sealed this

Twenty-fourth Day of April, 2007

JON W. DUDAS
*Director of the United States Patent and Trademark Office*